United States Patent [19]

Misek

[11] 3,874,945

[45] Apr. 1, 1975

[54] METHOD OF FABRICATING PLASTIC PRINTING PLATES

[76] Inventor: Vaclav Misek, 8515 Colonial Dr., Stockton, Calif. 90680

[22] Filed: Feb. 7, 1973

[21] Appl. No.: 330,290

Related U.S. Application Data

[63] Continuation-in-part of Ser. Nos. 163,008, July 15, 1971, abandoned, and Ser. No. 233,883, March 13, 1972, abandoned.

[52] U.S. Cl. .................. 96/36.3, 117/47 A, 96/87 R

[51] Int. Cl. ............................ G03c 5/00, G03f 7/00

[58] Field of Search ............. 96/36.3, 87 R; 156/14; 101/401.1; 117/47 A

[56] References Cited

UNITED STATES PATENTS

| | | | |
|---|---|---|---|
| 2,891,849 | 6/1959 | Whitbourne | 96/36.3 |
| 3,169,066 | 2/1965 | Hoerner | 96/35.1 |
| 3,271,150 | 9/1966 | Baxter et al. | 96/36.3 |
| 3,271,226 | 9/1966 | Staehle et al. | 156/14 |
| 3,474,728 | 10/1969 | Lenz et al. | 101/401.1 |
| 3,647,699 | 3/1972 | Doty et al. | 117/47 A |
| 3,761,299 | 9/1973 | Lidel | 96/87 R |

*Primary Examiner*—David Klein
*Attorney, Agent, or Firm*—Mark C. Jacobs

[57] ABSTRACT

Disclosed is a method of fabricating plastic printing plates.

The plate surface is treated to render it waterwettable, and a photoresist image is exposed and developed thereon. The areas within and intervening between the image pattern elements are then etched away by means of a solvent. Procedures are provided to promote the formation of supporting shoulders for the pattern elements during etching.

25 Claims, 8 Drawing Figures

METHOD OF FABRICATING PLASTIC PRINTING PLATES

REFERENCE TO PRIOR CO-PENDING APPLICATIONS

This is a continuation-in-part of my pending applications Ser. No. 163,008, filed July 15, 1971, and Ser. No. 233,883, filed Mar. 13, 1972 both now abandoned.

BACKGROUND OF INVENTION

A. Field of Invention

This invention relates to the field of printing and, in particular, to the fabrication of printing plates by photoengraving methods.

B. Description of Prior Art

Photoengraved printing plates now in use are typically fabricated by obtaining a matrix plate, exposing and developing on the plate a photoresist image in the pattern of the printing plate to be fabricated and etching away the portions of the plate matrix within and intervening between the photoresist image pattern elements.

Ordinarily, metallic plates are used. These are fabricated by various methods, such as that taught in U.S. Pat. No. 2,919,387, Easley and Hopkins. However, due to the resistance of metals to chemical etching, fabrication of metallic printing plates is a time-consuming process. This factor renders metallic printing plates costly and particularly ill-suited to situations where time is of the essence, e.g., in the production of newspaper extra editions. In addition, due to the relative inelasticity of most metallic sheets, metallic printing plates are difficult to bend into the cylindrical configuration needed for most printing operations after fabrication in a flat form. Finally, owing to the large specific gravity of most metals, metallic printing plates are quite heavy.

Plastic printing plates eliminate most of the above difficulties encountered with metal plates. However, plastic plates connot be satisfactorily fabricated by the methods heretofor in use. As illustrated by the teachings of U.S. Pat. No. 3,271,149, Stark and Jacoby, and U.S. Pat. No. 3,169,066, Hoerner, these methods typically utilize buffer layers between the plate matrix and the photoresist image and/or rather dilute etching solutions. These expendients are intended to create a strong bond between the image and the matrix and to avoid undercutting the image by a too-rapid etching of the matrix material. However, the use of dilute solvents increases the etching time and renders the fabrication process nearly as time consuming as that required for metallic plates, if not more so. In addition, in order to achieve the desired etching effect, dilute solvents must be rubbed into the matrix, increasing the probability of plate delamination and smearing of the image, the latter particularly troublesome in finely-meshed areas of the image.

Thus, the heretofor employed methods fail to capitalize on one of the most important potential advantages of plastic printing plates — speed and ease of fabrication.

SUMMARY OF THE INVENTION

Accordingly, it is an object to the present invention to provide a method of fabricating plastic printing plates which is simple, rapid, economical and reliable.

Briefly, the method of the present invention comprises providing a printing plate matrix which either comprises a plastic material capable of being rendered water-wettable or which has, on the surface on which the plate is to be fabricated, a layer of such material. The printing surface is then finely grained and rendered water-wettable by treatment with a chemical composition selected for that purpose. The photoresist image is then exposed and developed and the treated surface whereupon the material intervening within and between the photoresist image design elements is etched away by means of an appropriate solvent, thus yielding a printing plate having a raised design corresponding to the photoresist image.

Various embodiments of the basic method incorporate the use of a flexible etching medium to selectively etch away the central regions of this intervening material, the use of differential heating to promote the selective etching of those areas and the use of an etch resist coating to accomplish this same result.

DETAILED DESCRIPTION OF THE PREFERRED EMBODIMENTS

Figure 6:
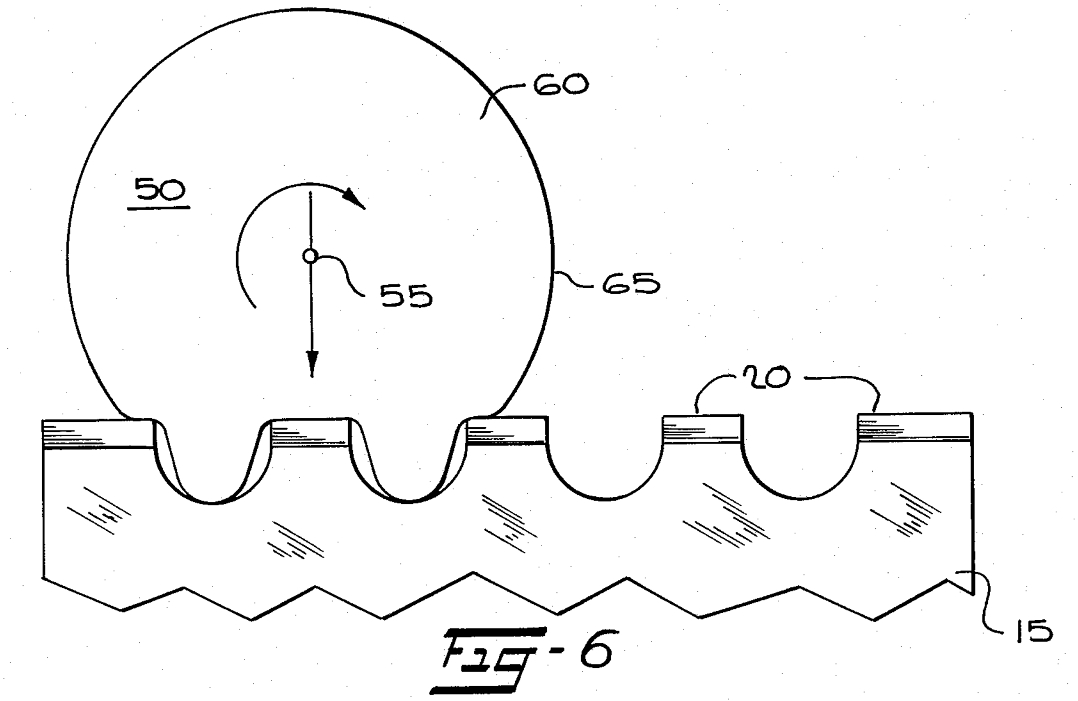
FIG. 6 is a sectional view of a partially etched printing plate illustrating the application of etching solution according to another embodiment of the present invention.
Figure 7:
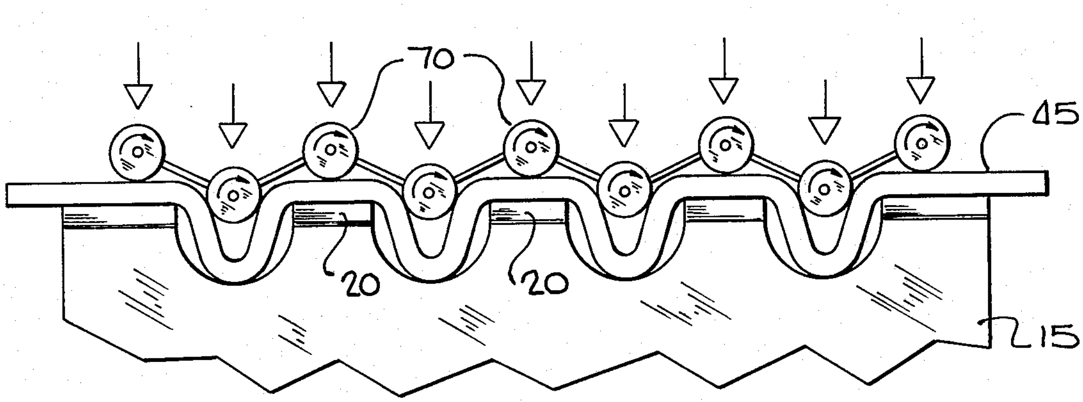
FIG. 7 is a sectional view of a partially etched printing plate illustrating the application of etching solution according to yet another embodiment of the present invention.
Figure 8:
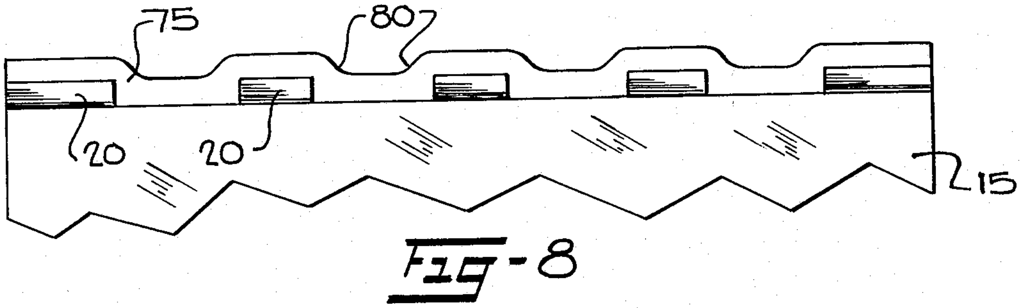
FIG. 8 is a sectional view of a portion of a plate matrix bearing a photoresist image and bearing a coating of an etch resist substance thereupon.
Figure 1:
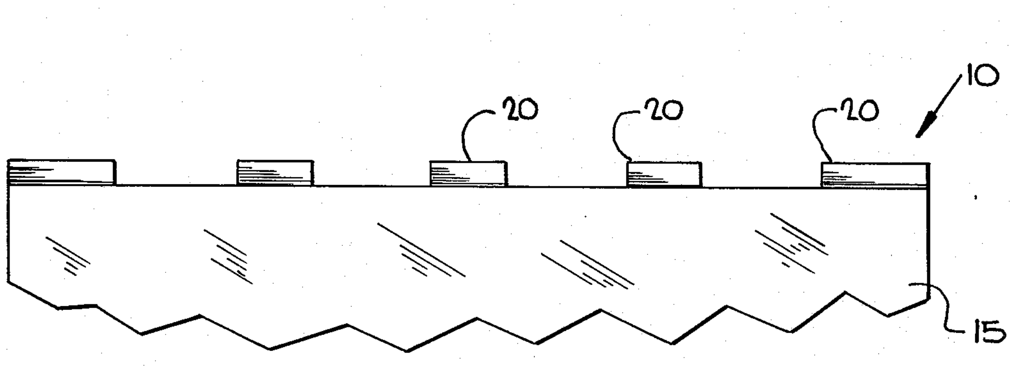
FIG. 1 is a sectional view of a plate matrix bearing a photoresist image on one surface.
Figure 2:
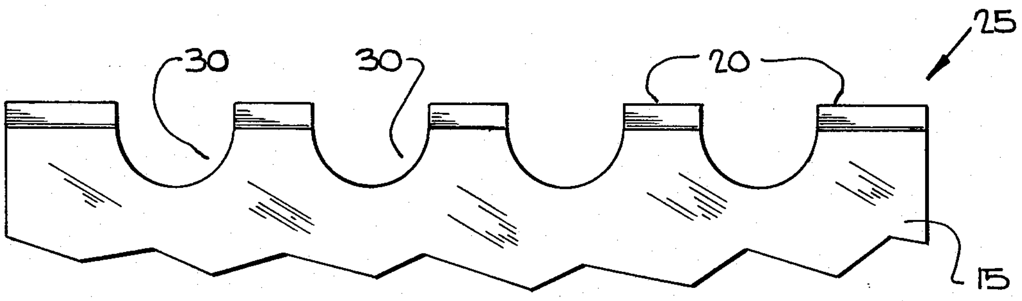
FIG. 2 is a sectional view of the plate shown in FIG. 1 after having been etched according to the method of the present invention.
Figure 3:
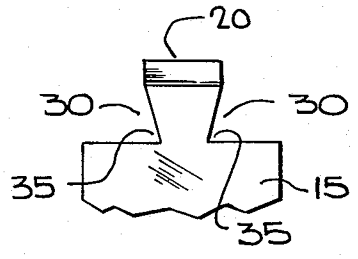
FIG. 3 is a detail sectional view of a portion of an etched printing plate showing undercutting of a photoresist image element.

The first step in fabricating a printing plate according to the preferred embodiment of the present invention is to select a plate matrix. The matrix may be entirely composed of a plastic substance or may be of any other substance with a plastic face bonded thereto by an convenient means. In any event, the active region of the plate matrix, i.e., that portion of one surface thereof on which the raised impression of the printing plate is to be created must be of a plastic material.

The plastic selected must be one which is capable of having its surface rendered water-wettable and finely grained by treatment with a chemical composition and which is also soluble in one or more solvent liquids. By recourse to the literature, those practicing this invention will find numerous examples of such plastic materials together with one or more such chemical treatment solutions and one or more such solvents particularly adaptable thereto. In particular, I have found that excellent results may be obtained if the plastic material selected is a polymer of acrylonitrile - butadiene - styrene (ABS). Where an ABS polymer is selected, the surface treatment can comprise any of the compositions taught by U.S. Pat. No. 3,647,699, Doty and Knight, although I prefer to use a treatment composition comprising 1–5 percent by weight sodium dodecyl benzene sulfonate, 5–25 percent by weight trisodium phosphate and approximately 0.9 percent by weight sodium hypochlorite and balance of abrasive unsoluble particles.

While in the preferred embodiment the entire plate matrix consists of a flat sheet of an ABS polymer having a thickness of 0.066 inch (the standard thickness of newspaper printing plates), it may be of cylindrical or any other aspect, depending on the particular application for the plate. In particular, the active region may be of one shape or aspect while the remainder of the plate matrix another, e.g., the active region might be curved in a cylindrical aspect while the remainder of the plate matrix might be flat or of some other shape and either permanently bonded to or removable from the active region. It should be noted, however, that a particular advantage of the plates fabricated according to the preferred embodiment of this invention is that, being of thin ABS plastic, they may be fabricated flat and easily curved into a cylindrical or other shape without material fatigue or image distorion.

The next step consists in rendering the surface of the active region finely grained and water-wettable. This step consists in treating the surface with a chemical composition particularly adapted for such use with the particular plastic selected. In the preferred embodiment the plate matrix constructed of an ABS polymer is treated with a solution having the composition given above.

Treatment consists in rubbing the treatment solution onto the active region, for example by brushing or by impregnating a clean cloth and rubbing the region in an irregular manner, whereupon the region is flushed with water. The treatment may be repeated as often as needed to render the surface finely grained and water-wettable. The operator will recognize that this condition obtains when the flush water flow freely over the region without appreciable resistance. It will be observed, at this point, that the region will have lost its lustrous appearance, having taken on a rather dull aspect.

A photoresist image is next applied to the active region of the plate matrix. This process is well known in the art to which this invention pertains and requires little discussion here. Suffice to say that it consist in applying a photosensitive surface to the treated active region of the plate matrix; selectively exposing that surface to light, such that an image in the design of the desired plate is created; developing the image and (ordinarily) removing the portions of the surface within and between the various elements of the design.

A principle advantage of the method of the present invention is that since virtually all such photosensitive coatings are water soluble, the photoresist image will be securely bonded to the plastic plate matrix thus improving the stability of the photoresist image during subsequent fabrication and use of the plate and obviating the necessity of intervening layers for bonding purposes.

The result is a photoresist image plate 10 having a plate matrix 15 and photoresist image pattern elements 20 bonded thereto.

Figure 4:
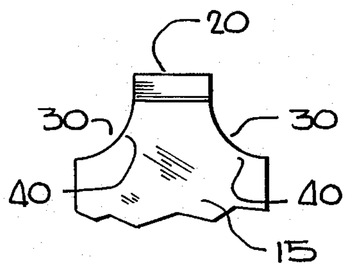
FIG. 4 is a detail sectional view of a portion of an etched printing plate illustrating shoulders supporting a photoresist image element.

The remaining step in my method consists in converting the photoresist image plate 10 to a final etched plate 25 by removing some of the material within and between the elements of the photoresist image design, creating etched portions 30. In order to improve the strength and reliability of the printing plate, it is necessary to avoid the creation of cutaway regions 35 which tend to undermine the raised portions of the plate. The preferred embodiment of the method of the present invention is particularly well-adapted to accomplish this since, rather than promoting the formation of such cutaway regions 35, it will promote the formation of shoulders 40 substantially as shown in FIG. 4. This greatly reduces the time required for etching according to my method, since full strength solvent solutions may be used without fear or undercutting.

The particular solvent chosen depends, of course, on the particular plastic material selected for the plate matrix and the relative solubility of the photoresist image in the various solvents of this material. It is desirable that the particular solvent selected be reasonably highly volatile so that upon application will tend to evaporate readily from the peaks of the photoresist elements, yet remain for a short time within the depressions (particularly the deepest, central portions thereof) for controlled etching. Reference to the literature will yield numerous examples of such solvents of wide application, such as $C_3H_6O$ (Acetone), $C_3H_6O_2$ (Methyl Acetate), $CH_2Cl_2$ (Methylene Chloride), as well as other particularly suitable for use in connection with the particular plastic material and photoresist selected.

While servicable printing plates may be fabricated merely by alternately applying and removing the solvent solution to the photoresist image plate 10, a superior plate is obtained if care is taken to promote the formation of shoulders 40 supporting the photoresist image pattern elements 20. This is particularly true if the photoresis image is finely-detailed. Thus, while the etched plate 25 may be fabricated by applying the solvent by means of a brush or impregnated cloth and blotting the residue away (which steps may be repeated a number of times), superior results may be obtained by a refinement of this basic procedure.

Figure 5:
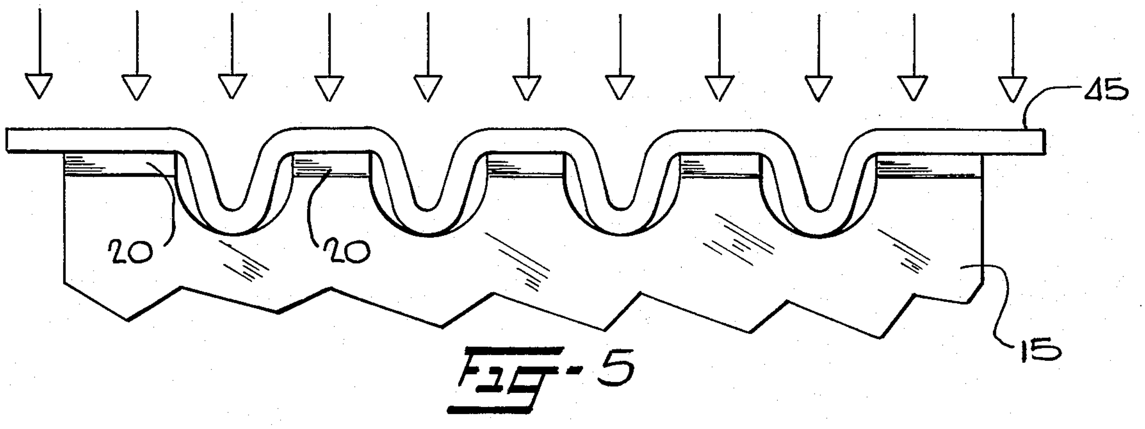
FIG. 5 is a sectional view of a partially etched printing plate illustrating the application of etching solution according to an embodiment of the present invention.

In particular, the solvent may be applied by means of an etching medium. An etching medium is here defined as a device capable of supporting the solvent on at least one surface thereof, that surface being sufficiently compliant to enter the spaces within and intervening between the photoresist image elements and touch at least a portion of the plate matrix. therein. when the medium is forcibly placed in juxtaposition with the photoresist image plate 10. For example, the etching medium might be merely a thin layer 45 of a paper textile material or rubber, as illustrated in FIG. 5. Likewise, it might be a roller 50 whose body 60 revolves about an axle 55 bringing its solvent surface 65 in forcible contact with the photoresist image plate 10, as illustrated in FIG. 6.

The etching medium may be brought into contact with the plate with any amount of force desired. For example, where a thin layer 45 is utilized, contact may be promoted by the use of elemental rollers 70 caused to forcibly roll move across the surface as shown in FIG.

7. Of course, in the typical case where the photoresist image is finely-detailed, the diameter of these elemental rollers must be quite small so that they are able to follow the contour of the plate surface. It is also obvious that the relative motion between the elemental rollers 70 and the plate (as well as that between the roller 50 and the plate, as shown in FIG. 6) can be created by movement of either or both depending on the particular apparatus utilized in the practice of the method of this invention.

In any case, the net effect is to cause the solvent to be applied primarily in the center region of the spaces within and between the photoresist image elements, which will tend to preferentially etch away those regions, promoting the formation of shoulders 40. Following each application of solvent, the residue (solvent and dissolved plastic) is removed, for example by blotting or passage of an absorbent roller or the like over the surface. The steps of applying the solvent and removing it may be alternately accomplished as many times as necessary to achieve the desired depth of etch.

I have found that it is particularly advantageous to increase the force with which the solvent is applied to the surface each time the steps are repeated (for example, by increasing the pressure on the etching medium) since I have discovered this further promotes the formation of shoulders 40. The probable reason is that during the first application(s), shallow depressions are apparently created in the central regions of the areas within and between the photoresist image elements. During later solvent applications, the liquid apparently tends to collect in these depressions, further deepening them.

An additional improvement over the basic method of the present invention consists in treating the photoresist image plate 10 such that the photoresist image achieves a higher temperature than the remaining areas of the plate. This can be accomplished by selection of the material comprising the photoresist image so that it will have greater heat absorption and retention characteristics than that of the plastic plate matrix material. Heating may be accomplished merely by exposing the photoresist image plate to electromagnetic radiation, e.g., infrared or ultraviolet. The advantage of this additional step is that since the photoresist image is at a higher temperature, the volatile solvent solution will evaporate more readily from the vicinity of its design elements thus insuring that there will be more solvent activity in the central portions of the remaining areas, further promoting the formation of shoulders 40. Of course, the steps of heating and etching may be alternately accomplished as many times as desired.

Yet another method of promoting the formation of shoulders 40 is to apply an etch resist coating 75 to the entire surface of the photoresist image plate 10 prior to the commencement or during some intermediate stage of the particular etching procedure chosen. An etch resist is simply a material which, while soluble in the particular solvent chosen, is not as soluble as the plastic plate matrix material. Again the literature may be consulted for the selection of a substance usable as an etch resist in the particular application.

The advantage of utilizing an etch resist coating 75 is that during the etching process, the portion of the coating covering the photoresist image pattern elements 20 and the portion of the coating in the areas within and between the elements will be etched away more rapidly than the portion of the coating within the crevices 80, owing, again, to lesser contact between the solvent and the latter.

Eventually, the etch resist coating 75 in the central regions of the areas within and between the image pattern elements will have been removed and etching in those areas will become very rapid. This will, of course, result in the formation of the desired shoulders 40.

Regardless of the particular embodiment of the basic method utilized, application of the solvent and removal of the residue thereof continues alternately until the desired depth of etch (usually about 0.035 inch) is achieved.

Thus, the present invention provides an inexpensive, rapid method of fabricating durable, reliable plastic printing plates.

While the step of etching has been illustrated with acetone, it is to be understood that equally satisfactory results can be obtained using any of methylene chloride, ethyl acetate, methyl acetate, benzene or butyl chloride as the organic solvent.

As previously recited, my treatment solution preferably contains sodium dodecyl benzene sulfonate and trisodium phosphate and sodium hypochlorite. Obviously, any alkali metal alkyl benzene sulfonate, and other related phosphates, can be utilized in conjunction with a hypochlorite ion forming compound. My most preferred treatment composition contains by weight:

2.5% sodium dodecyl benzene sulfonate
15% trisodium phosphate
0.9% sodium hypochlorite
81.6% nonactive ingredients including abrasive particulates.

This is used either in a water solution or as a paste.

It is understood that the details set forth herein are exemplary and are not intended to be limited.

I claim:

1. A method of fabricating a printing plate comprising the steps of: providing a plate matrix at least a part of one surface of which comprises a soluble plastic material which is capable of having its surface rendered water-wettable by treatment with a chemical solution; treating said portion of said surface with said; composition; applying a photoresist image to said treated portion of said surface; and etching away the remaining areas of said treated portion of said surface uncovered by the pattern of said image wherein said treatment solution comprises 1 to 5 percent by weight sodium dodecyl benzene sulfonate, 5 to 25 percent by weight trisodium phosphate and approximately 0.9 percent by weight sodium hypochlorite, with adequate water for processing.

2. Method as in claim 1, wherein said plastic material comprises a polymer of acrylonitrile - butadiene - styrene.

3. Method as in claim 1, wherein said portion of said surface is substantially flat.

4. Method as in claim 3, wherein said plate matrix is substantially flat.

5. Method as in claim 1, wherein said portion of said surface is curved.

6. Method as in claim 5, wherein said plate matiix is curved.

7. Method as in claim 1, wherein said step of treating comprises the steps of:

applying a quantity of said treatment composition to said portion of said surface; and removing said treatment solution from said portion.

8. Method as in claim 6, wherein said steps of applying and treatment composition removal are alternately accomplished two or more times.

9. Method as in claim 7, wherein said step of treatment solution removal comprises flushing with water.

10. Method as in claim 1, wherein said step of etching comprises the steps of:

placing, in contact with said treated portion of said surface, a solvent of said plastic material; and removing said solvent from said portion of said surface.

11. Method as in claim 10, wherein said steps of placing and solvent removal are alternately accomplished two or more times.

12. Method as in claim 10, wherein said step of placing comprises causing a surface of a device bearing a quantity of said solvent to be in juxtaposition with said portion of said surface.

13. Method as in claim 12, wherein said device is a brush.

14. Method as in claim 12, wherein said device is an etching medium.

15. Method as in claim 14, wherein said etching medium is caused to be in forcible contact with said portion of said surface.

16. Method as in claim 1, further including, between said step of applying and said step of etching, the additional step of heating said treated portion of said surface in such manner as to cause the photoresist image to achieve a higher temperature than said remaining areas.

17. Method as in claim 16, wherein said steps of heating and etching are alternately accomplished two or more times.

18. Method as in claim 16 wherein said step of heating comprises exposing to electromagnetic radiation which radiation is ultraviolet radiation.

19. Method as in claim 18, wherein said radiation comprises infrared radiation.

20. Method as in claim 10, wherein the solvent is applied by a means different from the means utilized to remove the excess solvent which has dissolved plastic therein.

21. Method as in claim 20, wherein the means utilized to remove the excess portion of solvent comprises a solvent absorbable surface.

22. The method of claim 1 wherein the treatment composition comprises:

2.5 percent sodium dodecyl benzene sulfonate;

15 percent trisodium phosphate;

0.9 percent sodium hypochlorite; and 81.6 percent abrasive particulates, including nonactive ingredients, with sufficient water for processing.

23. Method of rendering ABS plastic water-wettable and suitable for a printing plate comprising contacting the plastic with a composition comprising 1–5 percent by weight sodium dodecyl benzene sulfonate 5–25 percent by weight trisodium phosphate 0.9 percent by weight sodium hypochlorite mixed with sufficient water for processing.

24. The method of claim 23 wherein the composition for contacting the plastic is one comprising: 2.5 percent sodium dodecyl benzene sulfonate, 15% trisodium phosphate, 0.9 percent sodium hypochlorite and 81.6 percent abrasive particulates and nonactive ingredients, with sufficient water present for utilization.

25. The method of claim 24 wherein the plastic is A.B.S.

* * * * *